(12) United States Patent
Comeau et al.

(10) Patent No.: US 9,356,045 B2
(45) Date of Patent: May 31, 2016

(54) SEMICONDUCTOR STRUCTURE HAVING COLUMN III-V ISOLATION REGIONS

(71) Applicant: Raytheon Company, Waltham, MA (US)

(72) Inventors: Jonathan P. Comeau, Winchester, MA (US); Jeffrey R. LaRoche, Lowell, MA (US); John P. Bettencourt, Danvers, MA (US)

(73) Assignee: RAYTHEON COMPANY, Waltham, MA (US)

( * ) Notice: Subject to any disclaimer, the term of this patent is extended or adjusted under 35 U.S.C. 154(b) by 100 days.

(21) Appl. No.: 13/913,635

(22) Filed: Jun. 10, 2013

(65) Prior Publication Data

US 2014/0361371 A1  Dec. 11, 2014

(51) Int. Cl.
H01L 27/12 (2006.01)
H01L 21/8258 (2006.01)
H01L 21/762 (2006.01)
H01L 21/8234 (2006.01)

(52) U.S. Cl.
CPC ...... *H01L 27/1203* (2013.01); *H01L 21/76264* (2013.01); *H01L 21/8258* (2013.01); *H01L 27/1207* (2013.01); *H01L 21/823481* (2013.01)

(58) Field of Classification Search
CPC ............ H01L 27/1203; H01L 27/1207; H01L 21/76264
USPC .................. 257/289, 349, 350, 506
See application file for complete search history.

(56) References Cited

U.S. PATENT DOCUMENTS

| 5,677,231 A | 10/1997 | Maniar et al. |
| 6,130,458 A * | 10/2000 | Takagi et al. ............... 257/351 |
| 8,823,146 B1 * | 9/2014 | Hoke ........................ 257/628 |
| 2005/0121729 A1 | 6/2005 | Beach et al. |
| 2006/0087000 A1 * | 4/2006 | Okuno ...................... 257/506 |
| 2006/0128112 A1 | 6/2006 | Erickson et al. |
| 2008/0128808 A1 | 6/2008 | Yamazaki et al. |
| 2010/0295104 A1 | 11/2010 | Kaper et al. |
| 2011/0180857 A1 | 7/2011 | Hoke et al. |
| 2013/0062696 A1 | 3/2013 | Di et al. |

OTHER PUBLICATIONS

Notification of Transmittal of the International Search Report and the Written Opinion of the International Searching Authority, or the Declaration, PCT/US2014/037809, Sep. 16, 2014, 1 page.

(Continued)

*Primary Examiner* — Phat X Cao
(74) *Attorney, Agent, or Firm* — Daly, Crowley, Mofford & Durkee, LLP

(57) ABSTRACT

A semiconductor structure provided having: a dielectric; a non-column III-V doped semiconductor layer disposed over the dielectric; and an isolation barrier comprising column III-V material disposed vertically through the semiconductor layer to the dielectric. In one embodiment, the semiconductor layer is silicon and has CMOS transistors disposed in the semiconductor layer above a first region of the dielectric and a III-V transistor disposed above a different region of the dielectric. The barrier electrically isolates the column III-V transistor from the CMOS transistors. In one embodiment, the structure includes a passive device disposed over the semiconductor layer and a plurality of laterally spaced III-V structures, the III-V structures being disposed under the passive device, the III-V structures passing vertically through the semiconductor layer to the insulating layer.

26 Claims, 8 Drawing Sheets

(56) References Cited

OTHER PUBLICATIONS

International Search Report, PCT/US2014/037809, Sep. 16, 2014, 4 pages.

Written Opinion of the International Searching Authority, PCT/US2014/037809, Sep. 16, 2014, 6 pages.

PCT International Preliminary Report on Patentability and Written Opinion for PCT/US2014/037809 dated Dec. 23, 2015 8 pages.

* cited by examiner

SEMICONDUCTOR STRUCTURE HAVING COLUMN III-V ISOLATION REGIONS

TECHNICAL FIELD

This disclosure relates generally to semiconductor structure and more particularly to semiconductor structures having column III-V isolation regions therein.

BACKGROUND

As is known in the art, integrated circuits based on Silicon On Insulator (SOI) CMOS or standard silicon Complementary Metal Oxide Semiconductor (CMOS) processing typically addresses the issue of multiple supply voltages and multiple digital logic levels in various ways. SOI technologies are able to incorporate full-trench or partial trench isolation [see S. Maeda., et, al., "Feasibility of 0.18 um SOI CMOS technology using hybrid trench isolation with high resistivity substrate for embedded RF/analog applications," *IEEE Transactions on Electron Devices*, vol. 48, no. 9 Sep. 2001, pp. 2065-2073] resulting in either floating-body field-effect transistors (PET) or body-tied FET devices, with a terminal provided for the body of the transistor (FIG. 1). Alternatively, standard CMOS devices, which have a common p-type bulk connecting the body terminal of all nMOS transistors, use an additional deep n-type well implant to create a triple well structure [see U.S. Pat. No. 5,281,842, Yasuda, et. al, "Dynamic Random Access Memory with Isolated Well Structure" and U.S. Pat. No. 6,218,895 B1, De, et, al, "Multiple Well Transistor Circuits Having Forward Body Bias"] This additional well allows for an isolated nMOS device, which combined with standard pMOS devices, enables multiple supply voltages and logic voltage levels on a single integrated circuit (FIG. 2).

Silicon dioxide trench isolation can also be used to improve the quality factor of passive devices or structures formed above the silicon substrate. The trench isolation is placed directly below the passive devices to reduce the losses associated with the low resistivity substrate or any surface charge that may exist below the passive device, thus improving the quality factor of the component.

Although the approaches outlined above work well for SOI CMOS and standard CMOS technologies, they are not attractive solutions for III-V/CMOS heterogeneous integration technology. Recent research efforts have demonstrated the efficacy of a GaN-CMOS heterogeneously integrated technology [See T. Kazior, et. al., "High performance mixed signal and RF circuits enabled by the direct monolithic heterogeneous integration of GaN HEMTs and Si CMOS on a silicon substrate," *IEEE CSICS*, 2011], which enables the incorporation of GaN HEMT devices on the same silicon substrate as CMOS devices. The GaN HEMT devices are created on a GaN epitaxial buffer layer, which is grown in a window region of a silicon-on-insulator (SOI) wafer. The CMOS components are fabricated using a standard CMOS process flow in the thin silicon layer above the buried oxide layer (BOX).

Unlike fully-depleted and thin-film SOI CMOS devices, in which the source and drain implants extend all the way to the buried oxide layer, the source and drain implants of the CMOS devices only extend partially through the top silicon layer (similar to a thick-film SOI technology). This creates a shallow p-type material shared between all of the silicon components, essentially acting as a shallow bulk substrate for the CMOS components.

Although it may be possible to add full-trench isolation or an additional n-well implant to the process flow, it is undesirable. The incorporation of a full-trench isolation or an additional well implant will require additional masks and fabrication steps (resulting in higher costs), as well as additional processing complexity. The thickness of the GaN buffer layer and the thickness of the top-level of silicon material will need to be balanced against the full-trench isolation depth or the deep n-well implant depth during processing, creating additional constraints to the technology. The ability to create isolated FET devices and high quality passive devices, such as capacitors and inductors, without the use of full-trench isolation or deep well implants, would be advantageous to a heterogeneously integrated GaN-CMOS technology.

SUMMARY

In accordance with the disclosure, a semiconductor structure is provided having: a dielectric; a non-column III-V doped semiconductor layer disposed over the dielectric; and an electrically isolating barrier comprising column III-V material disposed vertically through the semiconductor layer to the dielectric.

In one embodiment, a semiconductor structure is provided having a pair or transistor devices, one of the pair of devices being a column III-V transistor device and the other one of the pair of transistor devices being a non-column III-IV transistor device. The structure includes: a substrate; a non-column III-V semiconductor layer disposed on the substrate, wherein the column III-V transistor device is formed over one region of the substrate and the non-III-V transistor device is formed over another region of the substrate; and a barrier of column III-V material disposed vertically through the semiconductor layer and around one of the pair of transistor devices to electrically isolate the column III-V transistor device from the non-III-V transistor device.

In one embodiment, the semiconductor layer is silicon and has CMOS transistors disposed in the semiconductor layer above a first region of the dielectric and a III-V transistor disposed above a different region of the dielectric. The column III-V isolating barriers electrically isolate the column III-V transistor from the CMOS transistors.

In one embodiment, the semiconductor layer is silicon and has silicon transistors disposed in the semiconductor layer above a first region of the dielectric and a III-V transistor disposed above a different region of the dielectric, the column III-V isolation barriers electrically isolates the column III-V transistor from the silicon transistor.

In one embodiment, the structure includes a passive device disposed over the semiconductor layer and a grid of 1 III-V isolation barriers, the III-V isolation barriers being disposed under the passive device, the III-V isolation barriers passing vertically through the semiconductor layer to the insulating layer.

In one embodiment, the non-column III-V semiconductor layer is disposed over the dielectric and the column III-V transistor device is formed over one region of the dielectric and the non-III-V transistor device is formed in a region of the semiconductor layer over another region of the substrate. The column III-V isolating barriers are disposed vertically through the semiconductor layer to the dielectric layer and around the column III-V transistor device or the non-III-V transistor device to electrically isolate the column III-V transistor device from the non-III-V transistor device.

In one embodiment, the non-column III-V transistor device is a column IV transistor device.

In one embodiment, the semiconductor layer is silicon and wherein the column IV device is a silicon transistor device.

In one embodiment, the semiconductor structure includes a second silicon transistor device in the semiconductor layer to provide CMOS transistor devices in the semiconductor layer and the barrier electrically isolates the CMOS transistor devices from the column III-V transistor device.

In one embodiment, the passive device is a microwave transmission line;

In one embodiment, the microwave transmission line is a coplanar waveguide;

In one embodiment, the passive device is a reactive element;

In one embodiment, the reactive element is an inductor.

In one embodiment, one of the CMOS transistors is formed in a doped region of the semiconductor layer and wherein the region has a type dopant opposite to that of the semiconductor layer.

With such structure, "dummy" III-V isolation barriers formed along with the formation of III-V transistor devices are incorporated to create isolated regions for nMOS and pMOS devices, as well as for shielding of passive devices from the substrate. The III-V isolation barrier material is used around the perimeter of single or multiple nMOS and/or pMOS transistors to create a tub of isolated p-type material for both nMOS and pMOS devices. This tub of isolated p-type material is also isolated from the bulk material by the buried oxide (BOX) layer associated with the Silicon On Insulator (SOI) material. More particularly, it is noted that the III-V transistor has an active region layer that a creates a gate channel (i.e. the region carriers pass between the source and drain electrodes under control of the gate electrode); however, this active region layer is not formed on the column III-V isolation barriers so that there are no carriers or associated sheet charge on the column III-V isolation barriers.

In one embodiment, the column III-V material is Gallium Nitride (GaN) and is used for the formation of the III-V transistor and the isolating barrier. Aluminum nitride (AlN) layer (directly under the GaN material) is a nucleation layer or transition layer that also acts as an insulator. Combining these non-conductive materials creates a perimeter around the nMOS and pMOS devices, effectively forming an isolated p-type region for the transistors. This isolates the devices from the rest of the wafer, enabling the use of various supply voltages, digital logic levels, and back gate biasing techniques for digital, analog, and RF circuits. This design capability is especially useful for a GaN-CMOS heterogeneously integrated platform, where the CMOS devices would create the bias and control circuitry for the GaN HEMT devices, which typically require negative gate biases ranging from −5V to 0V.

These GaN buffer layers can also be used as an RF shield for passive devices. Creating a mesh of GaN buffer layers under a passive circuit, such as a spiral inductor or a coplanar waveguide (CPW) transmission line reduces the loss created by the top silicon material or an induced electron density between the BOX layer and bulk substrate.

Thus, the use of GaN "dummy" (i.e., passive) isolation bathers creates an island or tub of isolated CMOS devices, enabling the use of an isolated substrate bias potential for the devices and also serves as an RF shield for passive devices, and provides a means to obtain multiple and disparate supply voltage levels, digital voltage levels, and analog voltage levels on a single integrated circuit, enabling simple interface circuits between GaN HEMT devices and the CMOS devices which will control them, in a heterogeneously integrated technology platform.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
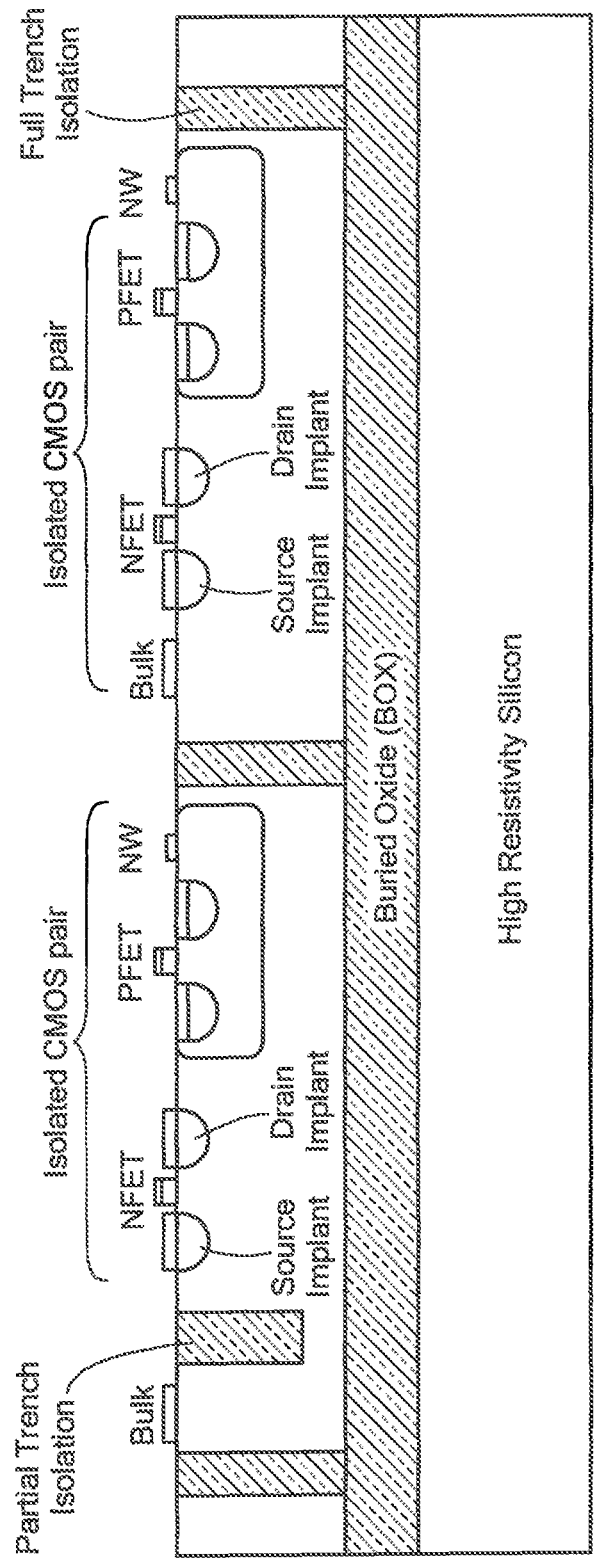
FIG. 1 is a diagrammatical sketch of CMOS transistors having one type of isolation according to the PRIOR ART.
Figure 2:
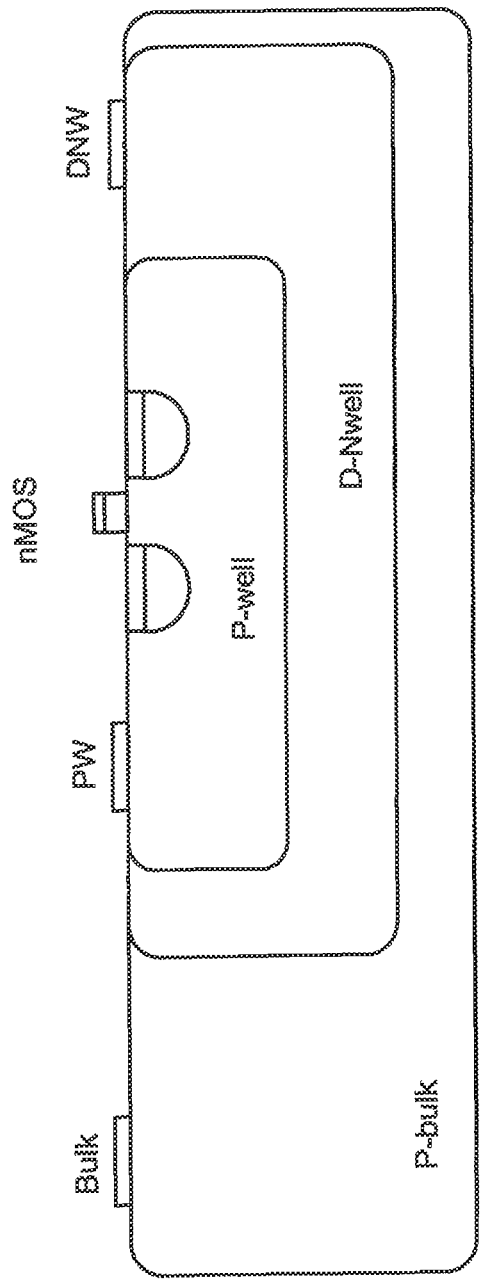
FIG. 2 is a diagrammatical sketch of CMOS transistors having another type of isolation according to the PRIOR ART.

Referring now to FIGS. 3A, 3B, 4A, 4B, and 5, a portion of a MMIC semiconductor structure 10 is shown prior to device interconnect (FIGS. 3A, 4A, 4B) and after final metallization (FIGS. 3B, 5), The portion of the structure 10 is shown to have both a column III-V transistor device 12, here for example, a GaN pHEMT, a passive microwave device (FIG. 3B) 14, here for example a spiral inductor and non III-V devices, here a pair of CMOS silicon transistors 16 providing nMOS transistor 26 and a separate pMOS transistor 18, all formed on a common substrate 20, here a silicon substrate, as shown.

Figure 3A:
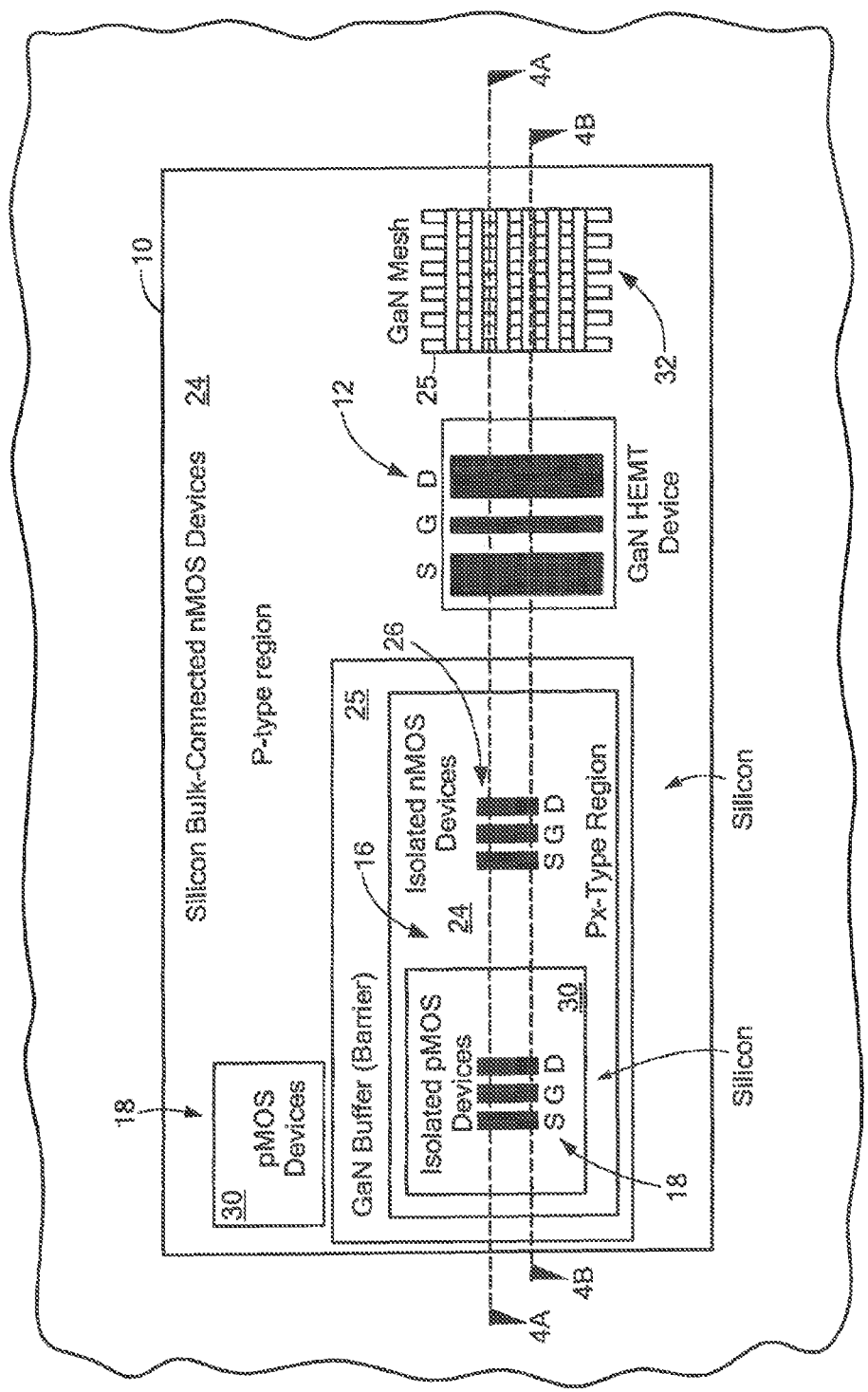
FIGS. 3A and 3B are diagrammatical sketches of a top view of a Monolithic Microwave Integrated Circuit (MMIC), FIG. 3A being prior to final metallization thereof and FIG. 3B being after the final metallization thereof, the MMIC having semiconductor regions of a heterogeneously integrated circuit incorporating GaN isolation barriers to create isolated nMOS and pMOS devices and a shielded passive device along with a microwave GaN FET transistor and non-isolated nMOS and pMOS devices according to the disclosure.
Figure 4A:
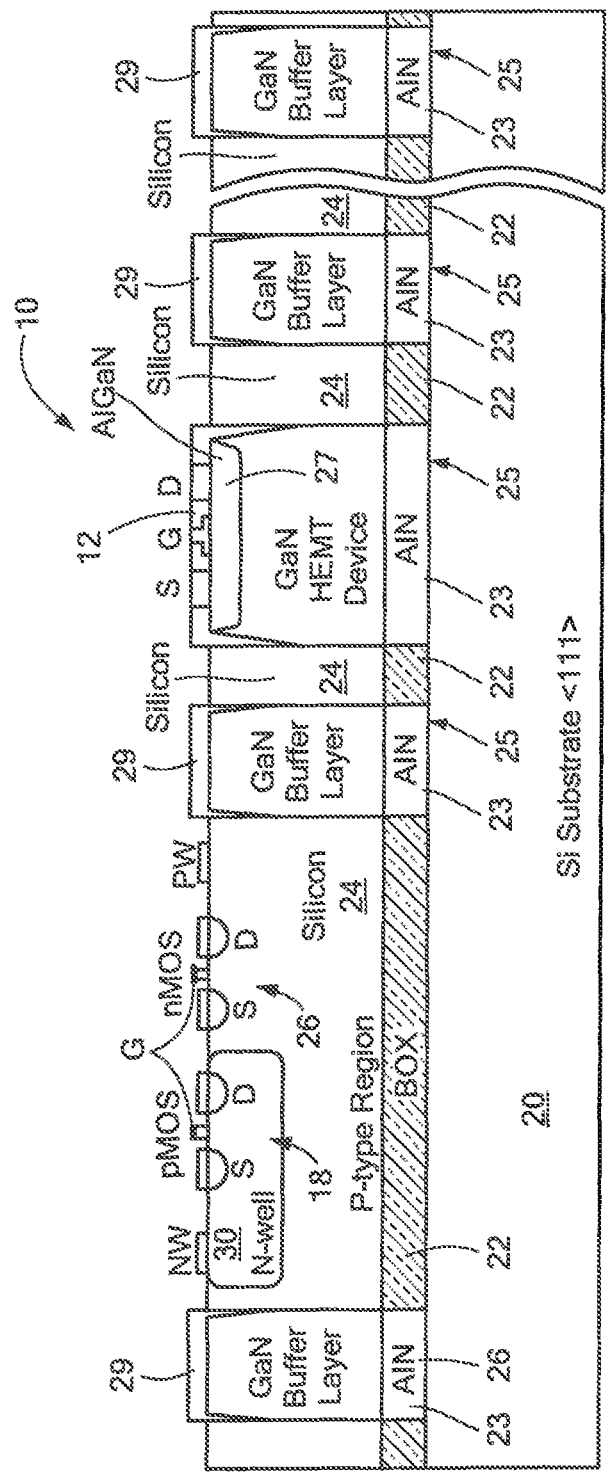
FIGS. 4A and 4B are diagrammatical cross sectional views of the MMIC of FIG. 3A, FIG. 4A being a cross section along line 4A-4A in FIG. 3A and FIG. 4B being a cross section along line 4B-4B of FIG. 3A according to the disclosure.
Figure 4B:
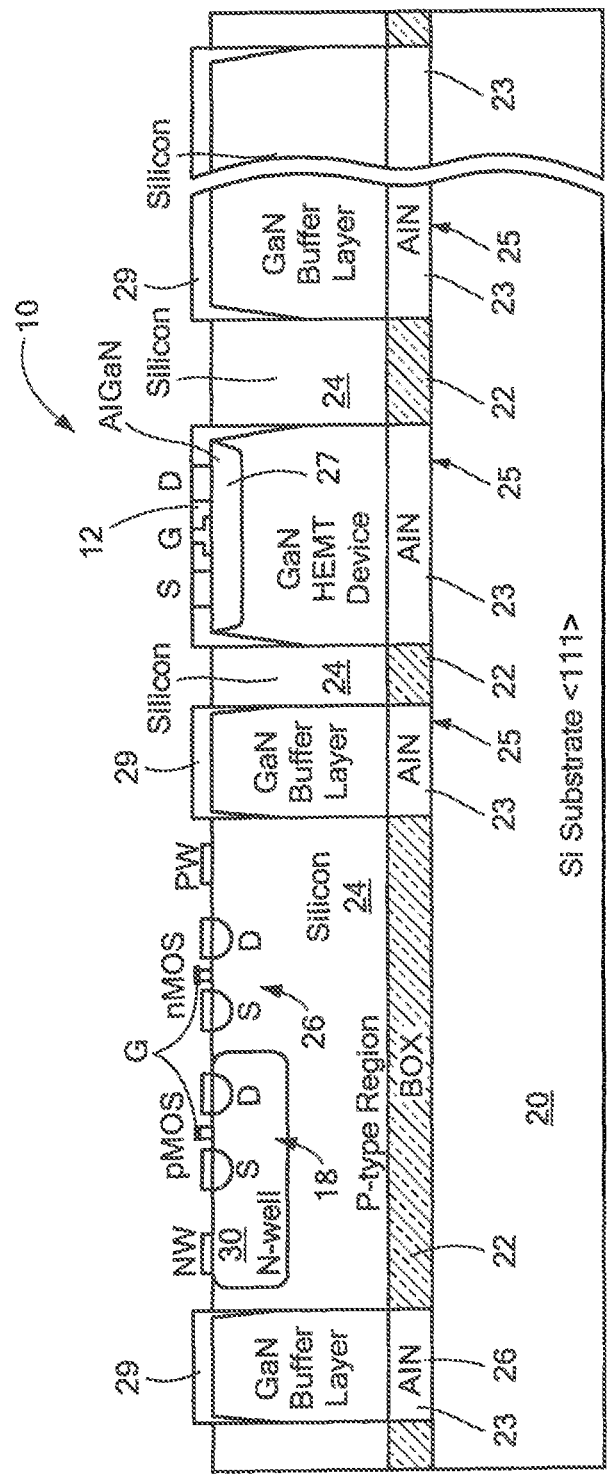

More particularly referring to FIGS. 4A and 4B, the semiconductor structure 10 is provided with a dielectric layer 22 here a buried oxide layer (BOX) on the silicon substrate 20. A non-column III-V doped semiconductor layer 24, here for example, p-type doped silicon, is disposed over the dielectric layer 22. It is first noted that the, p-type doped silicon layer 24 is vertically isolated from the bulk silicon substrate 20 by the buried oxide (BOX) layer 22 associated with the SOI material. It is next noted that the p-type doped silicon semiconductor layer 24 is separated horizontally into electrically isolated regions, or tubs, by vertically extending III-V isolation barriers 25 of column III-V material, here for example, the same column III-V material as part of the material forming the III-V transistor device 12 (FIG. 3A), here GaN, formed on the nucleation or transition layer 23, for example aluminum nitride (AlN), with a dielectric or protection layer 29 (FIGS. 4A, 4B), here silicon nitride (SiN) formed on the top of the GaN material. It is noted that the isolation barriers 25 of column III-V material are formed at the same time as the III-V material used for the III-V transistor devices 12; however the transistor devices 12 are formed in an active device semiconductor layer 27 (active region 27), here a layer of AlGaN; whereas the barriers 25 are not formed with an active device semiconductor layer. That is, the barriers 25 do not have active regions 27. Further, source (S), drain (D) and gate (G) contacts of the active transistor device 12 pass through the dielectric layer 29, in this case SiN, to make contact with the III-V active region 27 material, as indicated; whereas the III-V isolation bathers 25, as noted above, have no conductive regions 27. Thus, the III-V isolation barriers 25 (buffer layers) are formed such that there is no sheet associated charge (2 Dimension Electron Gas (2DEG)) associated with the active III-V regions and therefore the barriers 25 do not act as a conductor between silicon regions, nor with transistor devices.

The CMOS transistors 16, having source (S), drain (D) and gate (G) electrodes, are formed in a portion of the p-type semiconductor layer 24. More particularly, the p-type silicon 24 is a p-type tub, having a contact PW thereto, and the p-type tub 24 is used to form the nMOS transistors therein, such as nMOS transistor 18. Formed in the p-type semiconductor tub 24 are n-type doped wells 30. The n-type doped wells 30 have pMOS transistors 26 formed herein. A contact NW provided to contact the n-type doped well 30, as shown. As noted above, the pMOS transistors 18 (FIGS. 3A and 3B) are also formed separate isolation barrier 25 isolated regions of the p-type layer 24. Thus, the pMOS and nMOS transistors 26, 18 provide the CMOS transistors 16 within an island formed by barrier 25, (FIG. 3A).

Figure 3B:
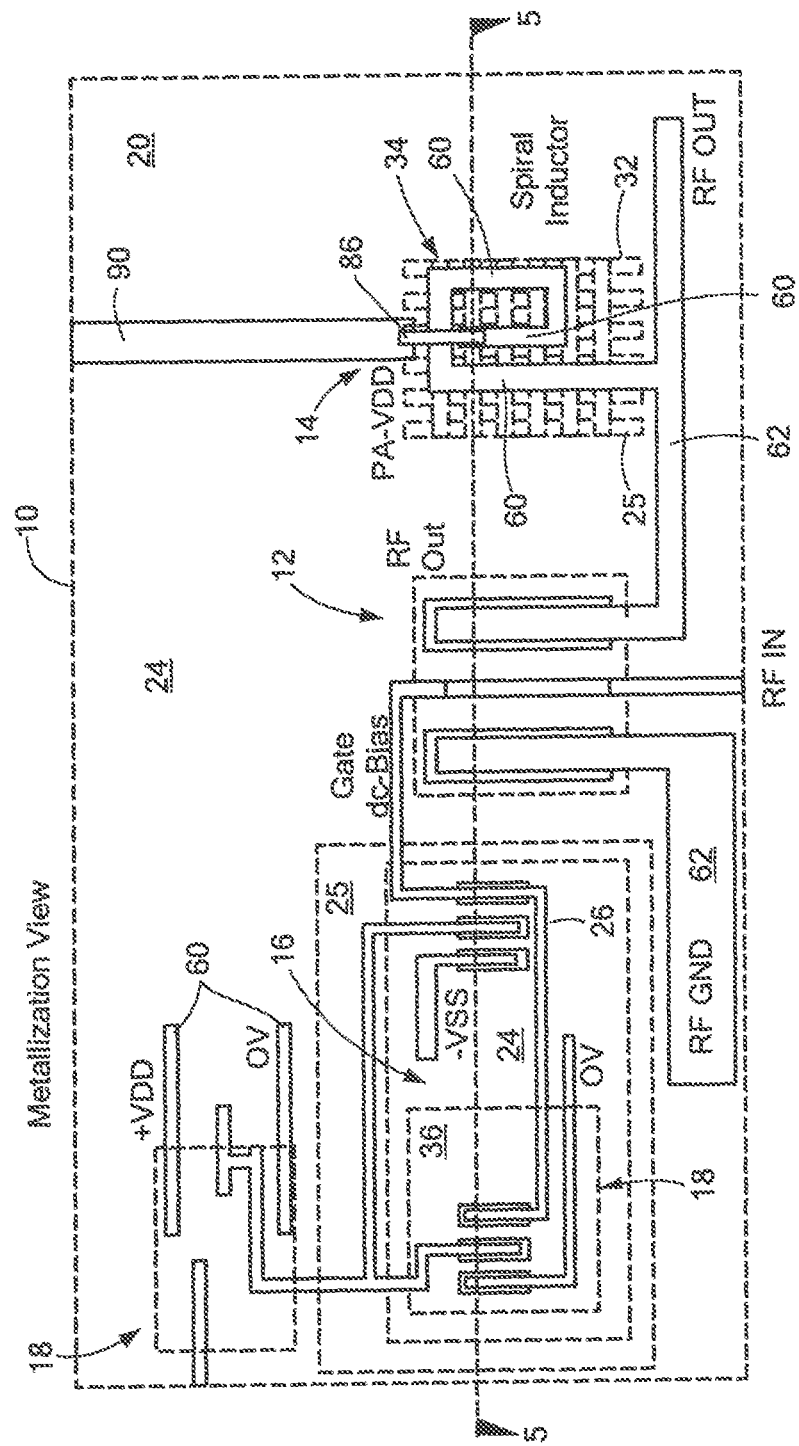
Figure 5:
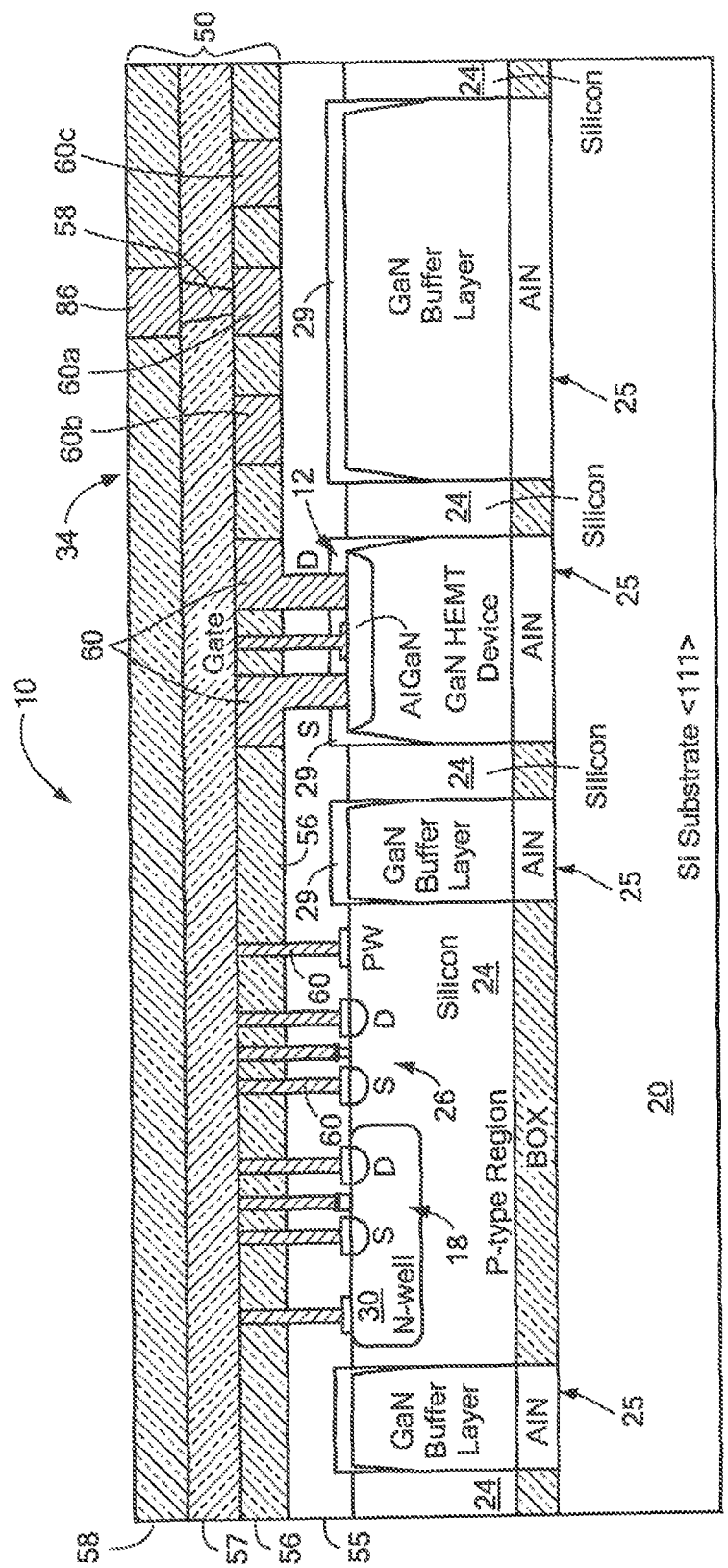
FIG. 5 is a diagrammatical cross sectional view of the MMIC of FIG. 3B, such cross section being along line 5-5 of FIG. 3B according to the disclosure.

It is noted that while one portion of barriers 25 isolates regions of the p-type layer 24 for the formation of different types of transistor devices, for example silicon p-type, silicon n-type, CMOS and III-V devices, for example, a second portion of the barriers 25 is arranged in a mesh 32 to also serve as an RF shield for passive devices, here for example a spiral inductor 34 shown in and FIGS. 3B and 5. The mesh 32 is made up of rows and columns of the barriers 25 and is disposed under a passive device 34 to reduce the loss created by the silicon layer 24 or an induced electron density between the BOX layer and bulk substrate.

Having formed the transistor devices 12, 18, 26, and the barriers 25, back-end of line (BEOL) layers 50 are formed creating the metallization, interconnect, insulation, dielectric, and passive devices associated with the technology (FIG. 5), Here, layers 55, 56, 57, and 58 representing a SiO2 dielectric layer with layers 60 and 86 representing the metallization layers. Here, layer 58 representing the via layer, connecting layer 60 to layer 86. It is noted that portions 60a, 60b, 60c of layer 60 are provide lower portions inductor 34 and portions of layer 86 provide upper portions of the inductor 34. The metallization layers provide electrical interconnects and power busses 60, microwave transmission lines 62, and passive devices, for example, as shown also in FIGS. 3B and 5. Here, the portion of the structure 10 includes a passive device, here the spiral inductor 34, disposed on the silicon dioxide layer. It is noted that the electrical interconnect 60 for the inductor 34 passes through dielectric 58 from an upper level of metallization to a lower level of metallization with a conductive via 86 (FIG. 5).

Figure 6:
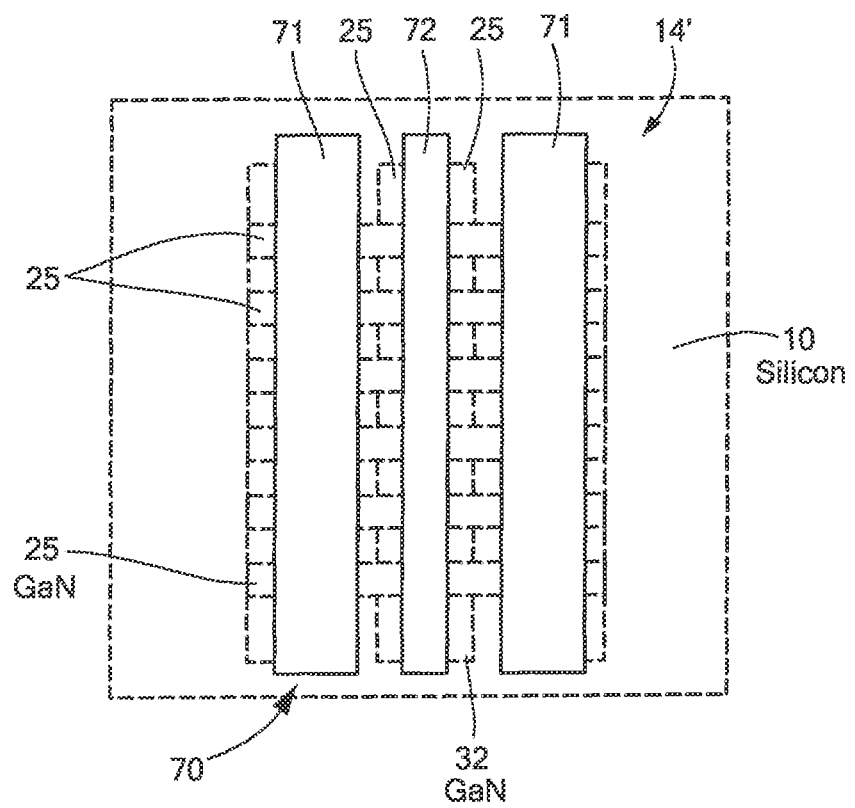
FIG. 6 is a top view of a portion of an MMIC having coplanar waveguide transmission line according to the disclosure.

It is noted that the columns 25 do not act as a conductor between silicon regions, nor do the dielectric layers associated with the III-V transistor devices. These dielectric layers include, for example, aluminum oxide ($Al_2O_3$), SiNx, SiO2, HfO2, or other materials, depending on the details of the fabrication process. Similarly, the aluminum nitride (AlN) layer (directly under the III-V buffer layer) also acts as an insulator. Combining these non-conductive materials creates a perimeter around the nMOS and pMOS devices, effectively forming an isolated p-type region for the transistors. This isolates the devices from the rest of the wafer, enabling the use of various supply voltages, digital logic levels, and back-gate biasing techniques for digital, analog, and RF circuits. (FIG. 5) This design capability is especially useful for a GaN-CMOS heterogeneously integrated platform, where the CMOS devices would create the bias and control circuitry for the GaN HEMT devices, which typically require negative gate biases ranging from −5V to 0V, as shown in FIG. 3B. As described, the barriers 25 under the passive device 34, are used as an RF shield for the passive devices. Creating a mesh of GaN buffer layers, as shown in FIG. 3A, under the passive circuit 34, such as the spiral inductor or a coplanar waveguide (CPW) transmission line 70 having a center strip conductor 72 disposed between a pair of ground plane conductors 71 formed on a separate region of the structure 10 for another mesh 14' (FIG. 6), reduces the loss created by the doped silicon layer or an induced electron density between the BOX layer and bulk silicon substrate.

A number of embodiments of the disclosure have been described. Nevertheless, it will be understood that various modifications may be made without departing from the spirit and scope of the disclosure. Accordingly, other embodiments are within the scope of the following claims.

What is claimed is:
1. A semiconductor structure, comprising:
   a substrate;
   a non-column III-V doped semiconductor layer disposed over the substrate, the non-column III-V doped semiconductor layer having a non-column III-V transistor formed therein;
   a transistor comprising a column III-V material disposed above a different region of the substrate and laterally spaced from the non-column III-V transistor;
   an isolation barrier comprising a column III-V material disposed vertically through the semiconductor layer and spaced laterally between the non-column III-V transistor and the column III-V transistor, the isolation barrier electrically isolating the column III-V transistor from the laterally spaced non-column III-V transistor; and
   a column III-V material disposed between a bottom of the transistor and the substrate; and
   wherein the column III-V material disposed between the bottom of the transistor and the substrate is the same as the material of the isolation barrier and is different from the column III-V material of the transistor.

2. The semiconductor structure recited in claim 1 wherein the semiconductor layer is silicon and has CMOS transistors disposed in the semiconductor layer above a first region of the substrate and wherein the isolation barrier is disposed laterally between the CMOS transistors and the column III-V transistor to electrically isolate the column III-V transistor from the CMOS transistors.

3. The semiconductor structure recited in claim 1 wherein the substrate is silicon and the semiconductor layer is silicon and has silicon transistors disposed in the semiconductor layer above a first region of the silicon substrate and a column III-V transistor disposed above a different region of the silicon substrate and wherein the isolation barrier electrically isolates the column III-V transistor from the silicon transistors.

4. The semiconductor structure recited in claim 1 including:
   a passive device disposed over the semiconductor layer; and a plurality of laterally spaced column III-V structures, the column III-V structures being disposed under the passive device, the column III-V structures passing vertically into the semiconductor layer.

5. The semiconductor structure recited in claim 3 including:
a passive device disposed over the semiconductor layer; and
a plurality of laterally spaced column III-V structures disposed under the passive device, the column III-V structures passing vertically into the semiconductor layer.

6. The semiconductor structure recited in claim 1 including:
a passive device disposed over the semiconductor layer; and
a mesh of column III-V structures, the column III-V structures being disposed under the passive device, the column III-V structures passing vertically into the semiconductor layer; and
wherein the mesh of column III-V structures is the same material as the isolation barrier.

7. The semiconductor structure recited in claim 3 including:
a passive device disposed over the semiconductor layer; and
a mesh of column III-V structures disposed under the passive device, the column III-V structures passing vertically into the semiconductor layer; and
wherein the mesh of column III-V structures is the same material as the isolation barrier.

8. The semiconductor structure recited in claim 1 wherein the isolation barrier comprises a lower transition layer and an upper buffer layer, and wherein the transistor has a device region disposed on top of a lower transistor region.

9. The semiconductor structure recited in claim 8 wherein the isolation barrier and the buffer layer are different materials.

10. A semiconductor structure having a column III-V transistor device and a non-column III-V transistor device therein, comprising:
a non-column III-V substrate;
a non-column III-V semiconductor layer disposed over the non-column III-V substrate;
wherein the transistor device comprising a column III-V material disposed over one region of the non-column III-V substrate and the non-column III-V transistor device is disposed in a region of the semiconductor layer over another region of the non-column III-V substrate;
a barrier of said column III-V material disposed vertically through the semiconductor layer laterally between the column III-V transistor device and the non-column III-V transistor device to electrically isolate the column III-V transistor device from the non-column III-V transistor device
a column III-V material disposed between a bottom of the transistor and the substrate; and
wherein the column III-V material disposed between the bottom of the transistor and the substrate is the same as the material of the isolation barrier and is different from the column III-V material of the transistor.

11. The semiconductor structure recited in claim 10 wherein the non-column III-V transistor device is a column IV transistor device.

12. The semiconductor structure recited in claim 11 wherein the substrate is silicon and the semiconductor layer is silicon and wherein the column IV device is a silicon transistor device.

13. The semiconductor structure recited in claim 12 including a second silicon transistor device in the semiconductor layer to provide CMOS transistor devices in the semiconductor layer and wherein the barrier electrically laterally isolates the CMOS transistor devices from the column III-V transistor device.

14. The semiconductor structure recited in claim 13 including:
a passive device disposed over the semiconductor layer; and
a plurality of laterally spaced column III-V structures disposed under the passive device, the column III-V structures passing vertically into the semiconductor layer.

15. The semiconductor structure recited in claim 14 wherein the passive device is a microwave transmission line.

16. The semiconductor structure recited in claim 15 wherein the microwave transmission line is a coplanar waveguide.

17. The semiconductor structure recited in claim 14 wherein the passive device is a reactive element.

18. The semiconductor structure recited in claim 17 wherein the reactive element is an inductor.

19. The semiconductor structure recited in claim 15 wherein one of the CMOS transistors is formed in a doped region of the semiconductor layer and wherein the region has a type dopant opposite to that of the semiconductor layer.

20. The semiconductor structure recited in claim 10 wherein the isolation barrier comprises a lower transition layer and an upper buffer layer, and wherein the transistor has a device region disposed on top of a lower transistor region.

21. The semiconductor structure recited in claim 20 wherein the isolation barrier and the buffer layer are different materials.

22. A semiconductor structure having a pair of transistor devices, one of the pair of devices being a transistor device having a column III-V material and the other one of the pair of transistor devices being a non-column III-V transistor device, comprising:
a non-column III-V substrate;
a non-column III-V semiconductor layer disposed on the substrate, wherein the column III-V transistor device is formed over one region of the substrate and the non-column III-V transistor device is formed over another region of the substrate; and
a barrier of said column III-V material disposed vertically through the semiconductor layer and laterally of the column III-V transistor device to laterally isolate one of the pair of transistor devices from the non-column III-V transistor device
a column material disposed between a bottom of the transistor and the substrate; and
wherein the column III-V material disposed between the bottom of the transistor and the substrate is the same as the material of the isolation barrier and is different from the column III-V material of the transistor.

23. The semiconductor structure recited in claim 22 wherein the non-column III-V transistor device is a column IV transistor device.

24. The semiconductor structure recited in claim 23 wherein the semiconductor layer is silicon and wherein the column IV device is a silicon transistor device.

25. The semiconductor structure recited in claim 22 wherein the isolation barrier comprises a lower transition layer and an upper buffer layer, and wherein the transistor has a device region disposed on top of a lower transistor region.

26. The semiconductor structure recited in claim 25 wherein the isolation barrier and the buffer layer are different materials.

* * * * *